US011146077B2

(12) United States Patent
Jeong et al.

(10) Patent No.: US 11,146,077 B2
(45) Date of Patent: Oct. 12, 2021

(54) VOLTAGE EQUALIZING DEVICE

(71) Applicant: Samsung SDI Co., Ltd., Yongin-si (KR)

(72) Inventors: Hyeoncheol Jeong, Yongin-si (KR); Gilchoun Yeom, Yongin-si (KR); Sanggu Lee, Yongin-si (KR); Seunglim Choi, Yongin-si (KR); Ji-Hoon Kim, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 229 days.

(21) Appl. No.: 16/434,114

(22) Filed: Jun. 6, 2019

(65) Prior Publication Data
US 2019/0379215 A1    Dec. 12, 2019

(30) Foreign Application Priority Data

Jun. 12, 2018    (KR) ........................ 10-2018-0067514

(51) Int. Cl.
*H02J 7/00*    (2006.01)
*H01M 10/44*    (2006.01)
*H01M 10/42*    (2006.01)
*H01M 10/48*    (2006.01)
(Continued)

(52) U.S. Cl.
CPC ......... *H02J 7/0019* (2013.01); *H01M 10/425* (2013.01); *H01M 10/441* (2013.01); *H01M 10/482* (2013.01); *H02J 7/0021* (2013.01); *H02J 7/022* (2013.01); *H03K 5/24* (2013.01); *H01M 2010/4271* (2013.01)

(58) Field of Classification Search
USPC .......................................................... 320/121
See application file for complete search history.

(56) References Cited

U.S. PATENT DOCUMENTS

| 2011/0193413 A1* | 8/2011 | Kudo | H02J 7/0029 307/77 |
| 2015/0140374 A1* | 5/2015 | Yamamoto | H01M 10/425 429/61 |
| 2017/0166078 A1* | 6/2017 | Elie | B60L 58/12 |

(Continued)

FOREIGN PATENT DOCUMENTS

| JP | 2014-3759 A | 1/2014 |
| KR | 10-2013-0071950 A | 7/2013 |

*Primary Examiner* — Mohammed Alam
(74) *Attorney, Agent, or Firm* — Lewis Roca Rothgerber Christie LLP

(57) ABSTRACT

A voltage equalizer includes: first, second, and third junction terminals respectively connected to a positive electrode of a first battery module, a positive electrode of a second battery module, and negative electrodes of the first and second battery modules; an equalizer circuit connected between the first and second junction terminals, and the equalizer forming a current path between the first and second junction terminals; a first indicator having a first displaying state that changes according to a voltage difference between the first and second junction terminals; a first comparator for outputting a first output voltage according to an input voltage that is input in proportion to a voltage between the first and third junction terminals; and a second indicator having a second displaying state that changes according to the first output voltage of the first comparator.

13 Claims, 4 Drawing Sheets

(51) Int. Cl.
*H02J 7/02* (2016.01)
*H03K 5/24* (2006.01)

(56) References Cited

U.S. PATENT DOCUMENTS

2017/0170668 A1* 6/2017 Hayashizaki ............. H02J 7/00
2019/0379215 A1* 12/2019 Jeong .................... H02J 7/0016

* cited by examiner

FIG. 2

| States | LED1 | LED2 | LED3 |
|---|---|---|---|
| Normal & voltage equalization finished | OFF | ON | ON |
| Normal & voltage equalization in progress | ON | ON | ON |
| Overdischarging | OFF | OFF | OFF |
| Fuse melted or bad fastening of J3 | OFF | ON | OFF |
| | OFF | ON | OFF |

VOLTAGE EQUALIZING DEVICE

CROSS-REFERENCE TO RELATED APPLICATION

This application claims priority to and the benefit of Korean Patent Application No. 10-2018-0067514 filed in the Korean Intellectual Property Office (KIPO) on Jun. 12, 2018, the entire contents of which are incorporated herein by reference.

BACKGROUND

1. Field

An exemplary embodiment of the present invention relates to a voltage equalizing device. More particularly, the exemplary embodiment of the present invention relates to a portable voltage equalizing device including a battery diagnosis function.

2. Description of the Related Art

Transportation devices that use electric motors as a power source, such as electric vehicles, golf carts, and electric bicycles, are increasingly being developed. Interest in high voltage battery systems for driving the electric motors is therefore also increasing.

Conventionally, a high voltage battery system includes a plurality of battery modules formed of at least one secondary cell. The secondary cells and battery modules may be coupled in series and/or in parallel in order to achieve the desired power characteristics.

An amount of charge stored in the respective battery modules are often not uniform because of characteristic differences among the battery modules. Thus, capacity and/or voltages of the battery modules may also be non-uniform. A non-uniform battery module may be a deteriorating factor of the battery module resulting in an overall lower performance of the battery system.

The above information disclosed in this Background section is only for enhancement of understanding of the background of the invention and therefore it may contain information that does not form the prior art that is already known in this country to a person of ordinary skill in the art.

SUMMARY

Exemplary embodiments according to the present invention provide for a portable voltage equalizing device including a battery module diagnosis function.

An exemplary embodiment of the present invention provides a voltage equalizer including: first, second, and third junction terminals respectively connected to a positive electrode of a first battery module, a positive electrode of a second battery module, and negative electrodes of the first and second battery modules; an equalizer circuit connected between the first and second junction terminals, the equalizer circuit forming a current path between the first and second junction terminals; a first indicator having a first displaying state that changes according to a voltage difference between the first and second junction terminals; a first comparator configured to output a first output voltage according to a first input voltage that is proportional to a voltage between the first and third junction terminals; and a second indicator having a second displaying state that changes according to the first output voltage of the first comparator.

The voltage equalizer may further include a fuse including a first terminal connected to the first junction terminal and a second terminal connected to the equalizer circuit, wherein the first comparator is configured to receive the first input voltage corresponding to a voltage between the first terminal of the fuse and the third junction terminal.

The voltage equalizer may further include a voltage divider connected between the first terminal of the fuse and the third junction terminal, wherein the voltage divider is configured to generate the first input voltage by dividing the voltage between the first terminal of the fuse and the third junction terminal, and to transmit the first input voltage of the first comparator.

The second indicator may include a light emitting diode connected between the first terminal of the fuse and the third junction terminal, and a switch connected between the light emitting diode and the third junction terminal, the switch being configured to activated according to the first output voltage of the first comparator.

The voltage equalizer may further include a second comparator configured to output a second output voltage according to a second input voltage that is proportional to a voltage between the second terminal of the fuse and the third junction terminal, and a third indicator having a third displaying state that changes according to the second output voltage of the second comparator.

The voltage equalizer may further include a voltage divider connected between the second terminal of the fuse and the third junction terminal, wherein the voltage divider is configured to divide the voltage between the second terminal of the fuse and the third junction terminal, and to transmit the second input voltage of the second comparator.

The third indicator may include a light emitting diode connected between the second terminal of the fuse and the third junction terminal, and a switch connected between the light emitting diode and the third junction terminal, the switch being configured to be activate according to the second output voltage of the second comparator.

The voltage equalizer may further include a switch connected between the first junction terminal and the equalizer circuit, and a controller configured to control the switch according to voltages of the first and second battery modules.

The equalizer circuit may include a load resistor connected between the first and the second junction terminal.

The voltage equalizer may further include a rectifier configured to perform full-wave rectification of a voltage between the first and second junction terminals and to output a resultant voltage to the first indicator.

The first indicator may include a light emitting diode connected between output terminals of the rectifier, the light emitting diode being configured to be activated according to the resultant voltage.

The voltage equalizer may further include at least one resistor connected between a first output terminal of the rectifier and the light emitting diode and configured to control a current flowing through the light emitting diode, and a Zener diode connected in parallel to the light emitting diode, and configured to control a voltage at respective ends of the light emitting diode.

The voltage equalizer may further include a capacitor connected between output terminals of the rectifier, wherein the capacitor is configured to smooth the resultant voltage.

According to the exemplary embodiment of the present invention, the portable voltage equalizing device including a battery module diagnosis function may be realized with a low cost.

BRIEF DESCRIPTION OF THE DRAWINGS

FIG. 2 shows examples of diagnosing states of battery modules according to displaying state of light emitting diodes of a voltage equalizing device according to an exemplary embodiment of the present invention.

DETAILED DESCRIPTION

Figure 1:
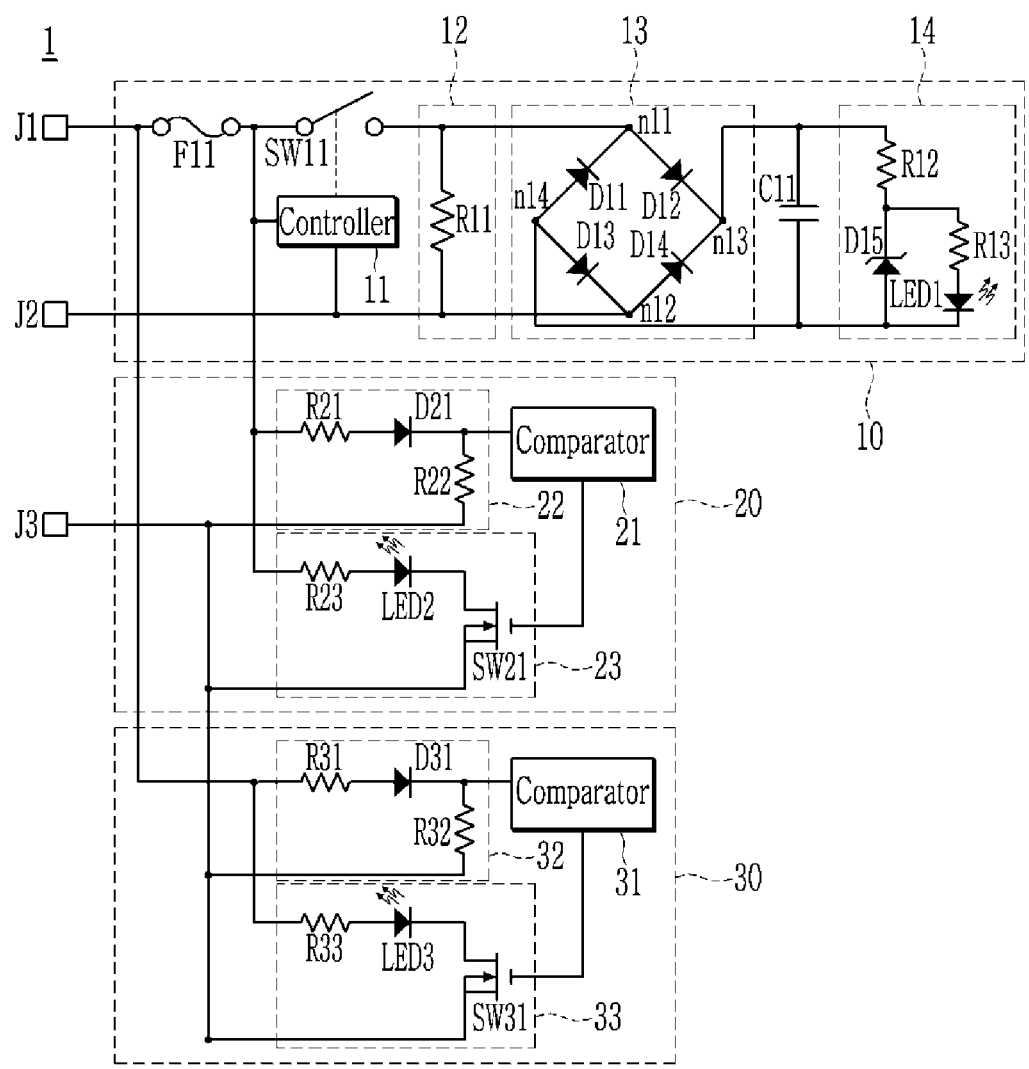
FIG. 1 shows a voltage equalizing device (i.e. a voltage equalizer) according to an exemplary embodiment of the present invention.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The voltage equalizing device (i.e. a voltage equalizer) and/or any other relevant devices or components according to embodiments of the present invention described herein may be implemented utilizing any suitable hardware, firmware (e.g., an application-specific integrated circuit), software, or a combination of software, firmware, and hardware. For example, the various components of these devices may be formed on one integrated circuit (IC) chip or on separate IC chips. The voltage equalizing device may include a voltage equalizer circuit, a first over-discharge diagnosis circuit, and a second over-discharge diagnosis circuit. The various circuits may for, example, include fuses, resistors, switches, capacitors, inductors, diodes, comparators, controllers, equalization circuitry, rectifying circuitry, and any other necessary circuitry and/or components.

Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other nontransitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Electrically connecting two constituent elements includes directly connecting two constituent elements and connecting the same with another constituent element therebetween. The other constituent element may include a switch, a resistor, and/or a capacitor. When the exemplary embodiments are described, an expression of connection signifies electrical connection when an expressed of direct connection is not provided.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

A voltage equalizing device (i.e., a voltage equalizer) according to an exemplary embodiment of the present invention will now be described with reference to accompanying drawings.

FIG. 1 shows a voltage equalizing device according to an exemplary embodiment of the present invention.

Referring to FIG. 1, the voltage equalizing device (i.e., a voltage equalizer) 1 according to an exemplary embodiment of the present invention may include a plurality of junction terminals J1, J2, and J3, a voltage equalizer circuit 10, a first over-discharge diagnosis circuit 20, and a second over-discharge diagnosis circuit 30.

The junction terminals J1, J2, and J3 may be electrically connected to electrode terminals of battery modules (not shown) that are targets of diagnosis and voltage equalization. For example, the junction terminal J1 may be electrically connected to a positive terminal of one of the battery modules targeted for voltage equalization (e.g., a first battery module), the junction terminal J2 may be electrically connected to a positive terminal of another one of the battery modules targeted for voltage equalization (e.g., a second battery module), and the junction terminal J3 may be electrically connected to negative terminals of the battery modules targeted for voltage equalization (e.g., connected to the negative terminals of the first and second battery modules). For ease of description, from among the battery modules connected to the voltage equalizing device 1 through the junction terminals J1, J2, and J3, the battery module connected through the junction terminals J1 and J3 will be referred to as a first battery module, and the battery module connected through the junction terminal J2 and J3 will be referred to as a second battery module.

The voltage equalizer circuit 10 performs a voltage equalizing function between the first and second battery modules. The voltage equalizer circuit 10 may include a fuse F11, a switch SW11, a controller 11, an equalizer circuit (or an equalizer) 12, a rectifying circuit (or a rectifier) 13, a smoothing capacitor C11, and an indicator circuit (or an indicator) 14.

The fuse F11 is provided on a current path between the junction terminal J1 and the equalizer circuit 12, and it may intercept a current flow between the junction terminal J1 and the equalizer circuit 12. That is, the fuse F11 is melted when an overcurrent that is equal to or greater than a reference value (e.g., a predetermined value) flows on the current path between the junction terminal J1 and the equalizer circuit 12, so the current flow between the junction terminal J1 and the equalizer circuit 12 may be intercepted (e.g., to protect the equalizer circuit 12).

FIG. 1 illustrates the case in which the fuse F11 is provided on the current path between the junction terminal J1 and the equalizer circuit 12, but the present invention is not limited thereto. For example, the fuse F11 may be provided on the current path between the junction terminal J2 and the equalizer circuit 12 (e.g. a first terminal of the fuse may be connected to the junction terminal J1 and a second terminal of the fuse may be connected to the equalizer circuit). In addition to the fuse F11 provided on the current path between the junction terminal J1 and the equalizer circuit 12, a fuse may also be in the current path between the junction terminal J2 and the equalizer circuit 12.

The switch SW11 is provided on the current path between the junction terminal J1 and the equalizer circuit 12. The switch SW11 may include a first terminal electrically connected to the junction terminal J1, a second terminal electrically connected to the equalizer circuit 12, and a control terminal to which a control signal is applied by the controller 11. Accordingly, the switch SW11 may be activated (e.g., turned on/off) according to the control signal applied to the control terminal by the controller 11 and it may intercept or allow the current flow between the junction terminal J1 and the equalizer circuit 12.

The controller 11 may turn on/off the switch SW11 by applying a control signal to the switch SW11. For example, the controller 11 may detect a voltage difference between the first and second battery modules, and when the voltage difference between the first and second battery modules is equal to or greater than a reference value (e.g., a predetermined or threshold value), it may turn on the switch SW11 to allow the current flow between the junction terminal J1 and the equalizer circuit 12. When a voltage of at least one of the first and second battery modules is equal to or less than a value (e.g., a predetermined or threshold value), that is, it is in the over-discharge state, the controller 11 may turn off the switch SW11 to intercept the current flow between the junction terminal J1 and the equalizer circuit 12. The controller 11 may intercept or allow the current flow between the junction terminal J1 and the equalizer circuit 12 by turning on or off the switch SW11 according to the control signal provided by the controller 11 (e.g., based on an input by a user).

The equalizer circuit 12 may perform a voltage equalizing function between the first and second battery modules by providing the current path that is electrically connected between the first and second battery modules and performing voltage equalization between the first and second battery modules. For example, the equalizer circuit 12 may include a load resistor R11 including a first end connected to the junction terminal J1 and a second end connected to the junction terminal J2.

The rectifying circuit 13 may be electrically connected between the junction terminals J1 and J2 and the indicator circuit 14, and it may perform full-wave rectification of a difference voltage between the first and second battery modules and may transmit a resultant voltage to the indicator circuit 14.

The rectifying circuit 13 may be configured with a bridge rectifier formed by four diodes D11, D12, D13, and D14. Accordingly, the rectifying circuit 13 may output a voltage with a same polarity to the output terminals n13 and n14 irrespective of the polarity of the voltage input through the input terminals n11 and n12. That is, the rectifying circuit 13 may output an output voltage with the same polarity corresponding to the difference voltage between the first and second battery modules regardless of whether a voltage of the first battery module or of the second battery module is higher.

The smoothing capacitor C11 may be electrically connected between output terminals n13 and n14 of the rectifying circuit 13, and it may perform a function of smoothing the output voltage of the rectifying circuit 13.

The indicator circuit 14 may be electrically connected between the output terminals n13 and n14 of the rectifying circuit 13, and it may display a current progress (e.g., a progressing state) of the current equalization based on the output voltage of the rectifying circuit 13. That is, it may display the progress (e.g., the progressing state) of the current equalization based on the voltage difference between the first and second battery modules.

For this, the indicator circuit 14 may include a displaying element that changes a displaying state according to the output voltage of the rectifying circuit 13. For example with reference to FIG. 1, the indicator circuit 14 may include a light emitting diode having an emission of light that is controlled according to the output voltage of the rectifying circuit 13, that is, a light emitting diode (LED1). While there is a voltage difference between the first and second battery modules and the voltage equalization is progressing, the light emitting diode LED1 may be activated (e.g., turned on to emit light) to display (or indicate) that the voltage equalization is in progress. On the contrary, when the voltage equalization between the first and second battery modules is completed and the voltage difference between the first and second battery modules is sufficiently reduced or eliminated, the light emitting diode LED1 may be deactivated (e.g., turned off) to display (or indicate) that the voltage equalization is completed.

The indicator circuit 14 may, as shown in FIG. 1, further include: resistors R12 and R13 connected in series with the light emitting diode LED1 between the output terminals n13 and n14 of the rectifying circuit 13 and controlling a current flowing to the light emitting diode LED1; and a Zener diode D15 connected in parallel to the light emitting diode LED1 and the resistor R13, and controlling a voltage at respective ends of the light emitting diode LED1.

Referring to FIG. 1, the current control resistors R12 and R13 may be connected in series between the output terminal n13 of the rectifying circuit 13 and an anode of the light emitting diode LED1. A cathode of the Zener diode D15 may be electrically connected to a connection node of the current control resistors R12 and R13, and the anode of the Zener diode D15 may be electrically connected to the cathode of the light emitting diode LED1.

The first over-discharge diagnosis circuit 20 is connected between respective ends of the first battery module through the junction terminals J1 and J3, and it diagnoses an over-discharge of the first battery module. The first over-discharge diagnosis circuit 20 may include a comparator 21, a voltage dividing circuit (or a voltage divider) 22, and an indicator circuit (or an indicator) 23.

The voltage dividing circuit 22 may drop the voltage of the first battery module within a reference range (e.g., a predetermined range) through a plurality of voltage dividing resistors connected in series between respective ends of the first battery module through the junction terminals J1 and J3, and may transmit the dropped voltage to the input terminal of the comparator 21. For example with reference to FIG. 1, the voltage dividing circuit 22 may include a resistor R21 connected between the junction terminal J1 and the input terminal of the comparator 21, and a resistor R22 connected between the input terminal of the comparator 21 and the junction terminal J3. Here, the resistor R21 may be connected to the connection node between the junction terminal J1 and a second terminal (e.g., end) of the fuse F11.

The voltage dividing circuit 22 may further include a diode D21 connected between the junction terminal J1 and the input terminal of the comparator 21 to prevent a reverse current.

The comparator 21 may compare the dropped voltage and a reference voltage, and may output a difference voltage (e.g., corresponding to a difference between the dropped voltage and the reference voltage) according to a comparison result. The dropped voltage of the comparator 21 corresponds to a voltage at the respective ends of the first battery module, and the voltage at the respective ends of the first battery module may be dropped by the voltage dividing circuit 22 and may be input to the comparator 21.

The indicator circuit 23 may display (or indicate) the over-discharged state of the first battery module by differentiating the displaying state (or indication state) according to the output voltage of the comparator 21.

For example, the indicator circuit 23 may include a light emitting diode LED1 connected between the junction terminals J1 and J3, and a switch SW21 for switching a turn-on/turn-off of the light emitting diode LED1. The indicator circuit 23 may further include a resistor R23 for controlling a current of the light emitting diode LED2.

The light emitting diode LED1 may include an anode connected between the junction terminal J1 and the fuse F11 and a cathode connected to the junction terminal J3 through the switch SW21, and its emission of light may be controlled by the turn-on/turn-off of the switch SW21.

The switch SW21 may include a first terminal connected to a cathode of the light emitting diode LED2, a second terminal connected to the junction terminal J3, and a control terminal connected to the output terminal of the comparator 21. The switch SW21 may allow or intercept the connection of the light emitting diode LED2 and the junction terminal J3 according to the output voltage of the comparator 21. For example, when the voltage of the first battery module is reduced to be less than a reference value (e.g., a predetermined value), that is, when the first battery module is over-discharged and the input voltage of the comparator 21 is equal to or less than a reference voltage, the switch SW21 is deactivated (e.g., turned off) by the output voltage of the comparator 21, so the connection between the light emitting diode LED2 and the junction terminal J3 is intercepted and the light emitting diode LED2 may be deactivated (e.g., turned off). Further, when the voltage of the first battery module is greater than a reference value (e.g., a predetermined value) and the input voltage of the comparator 21 is greater than a reference voltage, the switch SW21 is activated (e.g. turned on) by the output voltage of the comparator 21, so a current flows between the light emitting diode LED2 and the junction terminal J3 and the light emitting diode LED2 may be activated (e.g., turned on to emit light).

The second over-discharge diagnosis circuit 30 is connected between the respective ends of the first battery module through the junction terminals J1 and J3, and it diagnoses over-discharging of the first battery modules. The second over-discharge diagnosis circuit 30 may include a comparator 31, a voltage dividing circuit 32, and an indicator circuit 33. As shown in FIG. 1, the circuit configuration of the second over-discharge diagnosis circuit 30 corresponds to the circuit configuration of the first over-discharge diagnosis circuit 20, and so as to avoid provision of repeated descriptions, the operation of the second over-discharge diagnosis circuit 30 will not be described.

The comparator 31 of the second over-discharge diagnosis circuit 30 may receive the voltage of the first battery module (e.g., a proportional voltage of the voltage of the first battery module that is divided by the resistors R31 and R32 and includes a voltage drop across the diode D31) through the voltage dividing circuit 32 electrically connected to the first terminal (e.g., end) of the fuse F11. That is, it may receive the voltage of the first battery module without interference from the fuse F11. Therefore, the operator may diagnose a melting state of the fuse F11 or a bad fastening state of the junction terminal J3 by comparing displaying states between the indicator circuit 23 of the first over-discharge diagnosis circuit 20 and the indicator circuit 33 of the second over-discharge diagnosis circuit 30.

FIG. 2 shows examples of diagnosing states of first and second battery modules according to a voltage equalizer circuit 10 and displaying states of light emitting diodes of first and second over-discharge diagnosis circuit 20 and 30.

Referring to FIG. 2, when the voltage equalization between the first and second battery modules is finished while the voltage of the first and second battery modules is normal, the light emitting diode LED1 of the voltage equalizer circuit 10 may be turned off (e.g., deactivated), and the light emitting diodes LED2 and LED3 of the first over-discharge diagnosis circuit 20 and the second over-discharge diagnosis circuit 30 may be activated (e.g., turned on to emit light).

When the voltage equalization between the first and second battery modules is performed while the voltage of the first and second battery modules is normal, the light emitting diodes LED1, LED2, and LED3 of the voltage equalizer circuit 10, the first over-discharge diagnosis circuit 20, and the second over-discharge diagnosis circuit 30 may be turned on (i.e., may emit light).

When one of the first and second battery modules is in an over-discharging state (e.g., when the first battery module is in the over-discharging state in FIG. 1), the voltage equalization is stopped, the light emitting diode LED1 of the voltage equalizer circuit 10 is turned off, and the light emitting diodes LED2 and LED3 of the first over-discharge diagnosis circuit 20 and the second over-discharge diagnosis circuit 30 may be turned off.

When the fuse F11 is melted or the junction terminal J3 is erroneously fastened, the voltage equalization is stopped, the light emitting diode LED1 of the voltage equalizer circuit 10 may be turned off, one of the light emitting diodes LED2 and LED3 of the first over-discharge diagnosis circuit 20 and the second over-discharge diagnosis circuit 30 may be turned off and the other thereof may be turned on.

Hence, the operator may check whether the voltage equalization is finished, whether there is an over-discharging, or whether the voltage equalizing device 1 is operating normally by checking the displaying states of the light emitting diodes LED1, LED2, and LED3 of the voltage equalizer circuit 10 and the first and second over-discharge diagnosis circuits 20 and 30.

FIG. 1 has exemplified the case in which the over-discharge diagnosis circuits 20 and 30 are connected to the first battery module to diagnose the over-discharging state of the first battery module, to which the present invention is not limited. According to another exemplary embodiment, the over-discharge diagnosis circuits 20 and 30 may be connected to the second battery module through the junction terminals J2 and J3 so that they may be used to diagnose the over-discharging state of the second battery module. According to the other exemplary embodiment, the over-discharge diagnosis circuits 20 and 30 may be connected to respective sides of the first and second battery modules, and may be used for diagnosing over-discharging states of the first and second battery modules.

Figure 3:
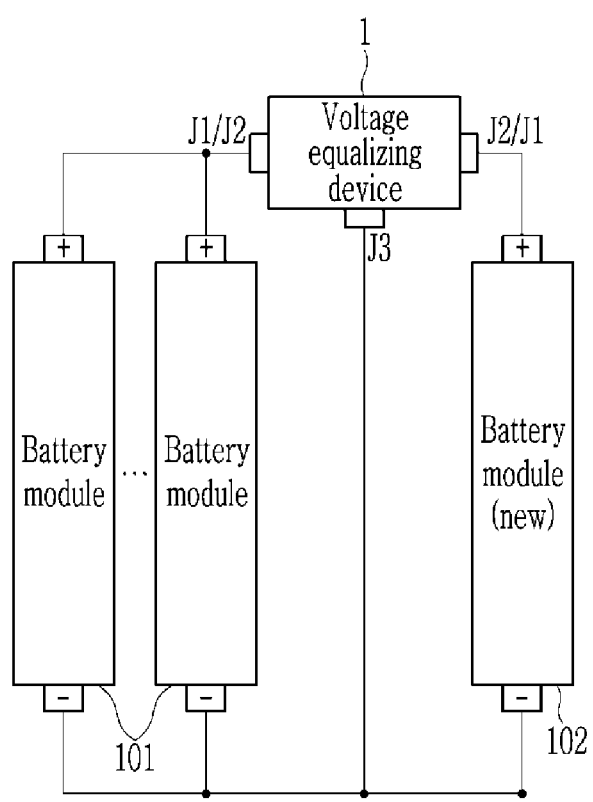
FIG. 3 and FIG. 4 show fastening (or connecting) examples between a voltage equalizing device according to an exemplary embodiment of the present invention and battery modules.
Figure 4:
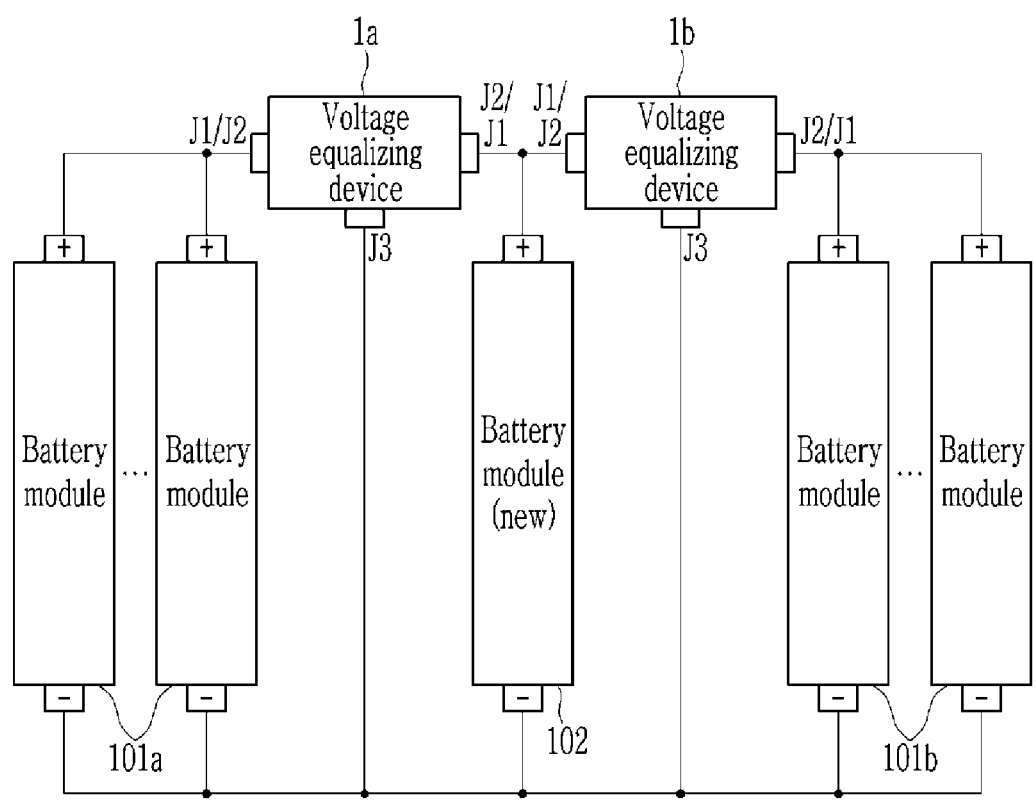

FIG. 3 and FIG. 4 show fastening (or connecting) examples between a voltage equalizing device according to an exemplary embodiment of the present invention and battery modules.

FIG. 3 exemplifies a case of fastening (or connecting) a voltage equalizing device 1 so as to allow a battery module on an edge to be replaced with a new battery module 102 in a battery system configured by connecting a plurality of battery modules in parallel.

Referring to FIG. 3, one voltage equalizing device 1 may be connected between a positive electrode of the battery module group 101 in use and a positive electrode of the new battery module 102 to perform voltage equalization. For this example, one of the junction terminals J1 and J2 of the voltage equalizing device 1 may be connected to the positive electrode of the battery module group 101 (e.g., the battery modules currently in use), the other one of the junction terminals J1 and J2 may be connected to the positive electrode of the new battery module 102, and the junction terminal J3 of the voltage equalizing device may be connected to the negative electrodes of the battery modules 101 and 102.

FIG. 4 exemplifies a case in which voltage equalizing devices 1a and 1b are fastened (or connected) so as to allow for an inner battery module (e.g., not in an edge location) to be replaced with the new battery module 102 in the battery system configured by connecting a plurality of battery modules in parallel.

Referring to FIG. 4, two voltage equalizing devices 1a and 1b may be connected to the positive electrodes of the battery module groups 101a and 101b in use and the positive electrode of the new battery module 102 to perform voltage equalization. For this, one of the junction terminals J1 and J2 of the voltage equalizing device 1a may be connected to the positive electrode of the battery module group 101a in use, the other one of the junction terminals J1 and J2 may be connected to the positive electrode of the new battery module 102, and the junction terminal J3 of the voltage equalizing device 1a may be connected to the negative electrodes of the battery modules 101a, 101b, and 102. One of the junction terminals J1 and J2 of the voltage equalizing device 1b may be connected to the positive electrode of the battery module group 101b in use, the other one of the junction terminals J1 and J2 may be connected to the positive electrode of the new battery module 102, and the junction terminal J3 of the voltage equalizing device 1b may be connected to the negative electrodes of the battery modules 101a, 101b, and 102.

According to the above-described exemplary embodiments, the voltage equalizing device according to an exemplary embodiment of the present invention may perform the voltage equalizing function between the battery modules, and may diagnose the over-discharging of the battery module and the normal operation state of the voltage equalizing device. Further, by using the elements (e.g., LEDs) with relatively low costs to realize the functions, the cost of the voltage equalizing device may be reduced, and the portable voltage equalizing device may be realized with a less complicated circuital configuration.

The accompanying drawings and the exemplary embodiments of the present invention are only examples of the present invention, and are used to describe the present invention but do not unduly limit the scope of the present invention as defined by the following claims. It will be understood by those of ordinary skill in the art that various modifications and equivalent embodiments may be made. Therefore, the technical scope of the present invention may be defined by the technical idea of the following claims and their equivalents.

What is claimed is:

1. A voltage equalizer comprising:
   first, second, and third junction terminals respectively connected to a positive electrode of a first battery module, a positive electrode of a second battery module, and negative electrodes of the first and second battery modules;
   an equalizer circuit connected between the first and second junction terminals, the equalizer circuit forming a current path between the first and second junction terminals;
   a first indicator having a first displaying state that changes according to a voltage difference between the first and second junction terminals;
   a first comparator configured to output a first output voltage according to a first input voltage that is proportional to a voltage between the first and third junction terminals; and
   a second indicator having a second displaying state that changes according to the first output voltage of the first comparator.

2. The voltage equalizer of claim 1, further comprising a fuse comprising a first terminal connected to the first junction terminal and a second terminal connected to the equalizer circuit,
   wherein the first comparator is configured to receive the first input voltage corresponding to a voltage between the first terminal of the fuse and the third junction terminal.

3. The voltage equalizer of claim 2, further comprising a voltage divider connected between the first terminal of the fuse and the third junction terminal, wherein the voltage divider is configured to generate the first input voltage by dividing the voltage between the first terminal of the fuse and the third junction terminal, and to transmit the first input voltage of the first comparator.

4. The voltage equalizer of claim 2, wherein
   the second indicator comprises:
   a light emitting diode connected between the first terminal of the fuse and the third junction terminal, and
   a switch connected between the light emitting diode and the third junction terminal, the switch being configured to be activated according to the first output voltage of the first comparator.

5. A voltage equalizer comprising:
   first, second, and third junction terminals respectively connected to a positive electrode of a first battery module, a positive electrode of a second battery module, and negative electrodes of the first and second battery modules;
   an equalizer circuit connected between the first and second junction terminals, the equalizer circuit forming a current path between the first and second junction terminals;
   a first indicator having a first displaying state that changes according to a voltage difference between the first and second junction terminals;
   a first comparator configured to output a first output voltage according to a first input voltage that is proportional to a voltage between the first and third junction terminals;
   a second indicator having a second displaying state that changes according to the first output voltage of the first comparator;
   a fuse comprising a first terminal connected to the first junction terminal and a second terminal connected to the equalizer circuit;
   a second comparator configured to output a second output voltage according to a second input voltage that is proportional to a voltage between the second terminal of the fuse and the third junction terminal; and
   a third indicator having a third displaying state that changes according to the second output voltage of the second comparator,
   wherein the first comparator is configured to receive the first input voltage corresponding to a voltage between the first terminal of the fuse and the third junction terminal.

6. The voltage equalizer of claim 5, further comprising a voltage divider connected between the second terminal of the fuse and the third junction terminal, wherein the voltage divider is configured to divide the voltage between the second terminal of the fuse and the third junction terminal, and to transmit the second input voltage to the second comparator.

7. The voltage equalizer of claim 5, wherein
   the third indicator comprises:
   a light emitting diode connected between the second terminal of the fuse and the third junction terminal; and
   a switch connected between the light emitting diode and the third junction terminal, the switch being configured to be activated according to the second output voltage.

8. The voltage equalizer of claim 1, further comprising a switch connected between the first junction terminal and the equalizer circuit, and
   a controller configured to control the switch according to voltages of the first and second battery modules.

9. The voltage equalizer of claim 1, wherein
   the equalizer circuit comprises a load resistor connected between the first and the second junction terminal.

10. The voltage equalizer of claim 1, further comprising:
    a rectifier configured to perform full-wave rectification of a voltage between the first and second junction terminals and to output a resultant voltage to the first indicator.

11. A voltage equalizer comprising:
    first, second, and third junction terminals respectively connected to a positive electrode of a first battery module, a positive electrode of a second battery module, and negative electrodes of the first and second battery modules;
    an equalizer circuit connected between the first and second junction terminals, the equalizer circuit forming a current path between the first and second junction terminals;
    a first indicator having a first displaying state that changes according to a voltage difference between the first and second junction terminals;

a first comparator configured to output a first output voltage according to a first input voltage that is proportional to a voltage between the first and third junction terminals;

a second indicator having a second displaying state that changes according to the first output voltage of the first comparator; and a rectifier configured to perform full-wave rectification of a voltage between the first and second junction terminals and to output a resultant voltage to the first indicator, wherein the first indicator comprises a light emitting diode connected between output terminals of the rectifier, the light emitting diode being configured to be activated according to the resultant voltage.

12. The voltage equalizer of claim 11, further comprising:

at least one resistor connected between a first output terminal of rectifier and the light emitting diode and configured to control a current flowing through the light emitting diode; and a Zener diode connected in parallel to the light emitting diode, and configured to control a voltage at respective ends of the light emitting diode.

13. The voltage equalizer of claim 10, further comprising:

a capacitor connected between output terminals of the rectifier, and the capacitor being configured to smooth the resultant voltage.

* * * * *